(12) United States Patent
Hebert

(10) Patent No.: US 12,520,523 B2
(45) Date of Patent: Jan. 6, 2026

(54) FIELD-EFFECT TRANSISTORS WITH A HIGH-TEMPERATURE HARDMASK AND SELF-ALIGNED P-SHIELD

(71) Applicant: GlobalFoundries U.S. Inc., Malta, NY (US)

(72) Inventor: Francois Hebert, San Mateo, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 375 days.

(21) Appl. No.: 18/103,776

(22) Filed: Jan. 31, 2023

(65) Prior Publication Data
US 2024/0258421 A1    Aug. 1, 2024

(51) Int. Cl.
*H10D 30/66* (2025.01)
*H10D 12/01* (2025.01)
*H10D 30/01* (2025.01)
*H10D 62/832* (2025.01)

(52) U.S. Cl.
CPC ......... *H10D 30/668* (2025.01); *H10D 12/031* (2025.01); *H10D 30/0297* (2025.01); *H10D 62/8325* (2025.01)

(58) Field of Classification Search
CPC .............. H10D 30/668; H10D 12/031; H10D 30/0297; H10D 62/8325; H10D 62/127; H10D 62/107; H10D 62/393; H10D 64/513
See application file for complete search history.

(56) References Cited

U.S. PATENT DOCUMENTS

| | | |
|---|---|---|
| 5,567,634 A | 10/1996 | Hebert et al. |
| 5,641,695 A | 6/1997 | Moore et al. |
| 6,180,958 B1 | 1/2001 | Cooper, Jr. |
| 7,498,633 B2 | 3/2009 | Cooper et al. |

(Continued)

FOREIGN PATENT DOCUMENTS

| | | |
|---|---|---|
| WO | 2018212282 A1 | 11/2018 |
| WO | 2019101009 A1 | 5/2019 |

OTHER PUBLICATIONS

D. G. Senesky and A. P. Pisano, "Aluminum nitride as a masking material for the plasma etching of silicon carbide structures," 2010 IEEE 23rd International Conference on Micro Electro Mechanical Systems (MEMS), Hong Kong, China, 2010, pp. 352-355, doi: 10.1109/MEMSYS.2010.5442492.

(Continued)

*Primary Examiner* — Mohammad A Rahman
(74) *Attorney, Agent, or Firm* — Thompson Hine LLP; Francois Pagette

(57) ABSTRACT

Structures for a field-effect transistor and methods of forming a structure for a field-effect transistor. The structure comprises a semiconductor substrate including a top surface, a doped region adjacent to the top surface, and a trench that extends through the doped region. The semiconductor substrate comprises a wide bandgap semiconductor material. The structure further comprises a gate structure including a gate conductor layer in the trench, and a dielectric layer on the top surface of the semiconductor substrate. The dielectric layer includes an opening that is aligned with the trench in the semiconductor substrate, and the dielectric layer comprises a material with a melting point that is greater than or equal to 2000° C.

20 Claims, 13 Drawing Sheets

(56) References Cited

U.S. PATENT DOCUMENTS

| | | | |
|---|---|---|---|
| 11,563,080 | B2 | 1/2023 | Lichtenwalner |
| 2004/0124461 | A1 | 7/2004 | Gajda |
| 2006/0197148 | A1 | 9/2006 | Hsu |
| 2010/0224932 | A1 | 9/2010 | Takaya et al. |
| 2011/0136310 | A1 | 6/2011 | Grivna |
| 2011/0241644 | A1* | 10/2011 | Hashimoto ........ H10D 30/0295 |
| | | | 257/329 |
| 2013/0065384 | A1 | 3/2013 | Hiyoshi et al. |
| 2014/0170823 | A1 | 6/2014 | Lin |
| 2014/0196863 | A1* | 7/2014 | Bates ................ B22D 13/102 |
| | | | 106/38.27 |
| 2016/0099316 | A1 | 4/2016 | Arai et al. |
| 2016/0260608 | A1 | 9/2016 | Ikeda et al. |
| 2016/0293441 | A1 | 10/2016 | Lee et al. |
| 2018/0197947 | A1 | 7/2018 | Iwaya et al. |
| 2020/0020762 | A1 | 1/2020 | Frank et al. |
| 2021/0119039 | A1* | 4/2021 | Miida ................ H10D 62/393 |
| 2021/0343834 | A1 | 11/2021 | Lichtenwalner |
| 2023/0122090 | A1* | 4/2023 | Fiorenza ............ H10D 30/475 |
| | | | 257/76 |
| 2023/0253458 | A1 | 8/2023 | Matsunaga et al. |
| 2023/0420527 | A1 | 12/2023 | Sampath et al. |
| 2024/0063309 | A1 | 2/2024 | Hebert et al. |

OTHER PUBLICATIONS

T. Dai, Z. Mohammadi, S. A. O. Russell, C. A. Fisher, M. R. Jennings and p. A. Mawby, "4H-SiC trench structure fabrication with Al2O3 etching mask," 2016 European Conference on Silicon Carbide & Related Materials (ECSCRM), Halkidiki, Greece, 2016, pp. 1-1, doi: 10.4028/www.scientific.net/MSF.897.371.

Fu, Xiao-An & Dunning, Jeremy & Zorman, Christian & Mehregany, Mehran. (2005). "Polycrystalline 3C-SiC thin films deposited by dual precursor LPCVD for MEMS applications." Sensors and Actuators A: Physical. 119. 169-176. 10.1016/j.sna.2004.09.009.

Guy Chichignoud, Laurent Auvray, Elisabeth Blanquet, Mikhail Anikin, Etienne Pernot, et al.. "Processing of Poly-SiC Substrates with Large Grains for Wafer-Bonding." Materials Science Forum, 2006, 527-529, pp. 71-74.

Thomas M. Sullivan, "Large polycrystalline wafers boost SiC's prospects." III-Vs Review, vol. 12, Issue 5, 1999, pp. 34-37, ISSN 0961-1290, https://doi.org/10.1016/S0961-1290(00)80024-1.

Saravanan, Solangkili & Berenschot, J.W. & Krijnen, Gijs & Elwenspoek, M.. (2004). "Surface Micromachining Process for the Integration of AlN Piezoelectric Microstructures." Journal of Materials Processing Technology.

J. R. Mileham et al., "Wet chemical etching of AlN." Applied Physics Letters, vol. 67, Issue 8, https://doi.org/10.1063/1.114980, pp. 1119-1121 (Aug. 21, 1995).

Sandia National Laboratories. "Ultra-High-Temperature Ceramics to Withstand 2000 Degrees Celsius." ScienceDaily. ScienceDaily, Oct. 21, 2003. <www.sciencedaily.com/releases/2003/10/031020055530.htm>.

Hebert, Francois, "Field-Effect Transistors Formed Using a Wide Bandgap Semiconductor Material" filed on Jan. 19, 2023 as a U.S. Appl. No. 18/098,999.

Hebert, Francois, "Field-Effect Transistors With Self-Aligned P-Shield Contacts" filed on Feb. 13, 2023 as a U.S. Appl. No. 18/109,126.

European Patent Office, Extended European Search Report and Opinion issued in European Patent Application No. 23206305.7 on May 7, 2024; 11 pages.

European Patent Office, Extended European Search Report and Opinion issued in European Patent Application No. 23205075.7 on Apr. 2, 2024; 12 pages.

European Patent Office, Extended European Search Report and Opinion issued in European Patent Application No. 23205387.6 on May 16, 2024; 8 pages.

Xinxin Zuo et al., "A 1200 V SiC Trench MOSFET with a Laterally Widened P-Shield Region to Enhance the Short-Circuit Ruggedness." Electronics 2022, vol. 11, Issue 7, 1077, pp. 1-12; https://doi.org/10.3390/electronics11071077.

Fukui, Yutaka, et al., "Effects of Grounding Bottom Oxide Protection Layer in Trench-Gate SiC-MOSFET by Tilted Al Implantation." Materials Science Forum, vol. 1004, Trans Tech Publications, Ltd., Jul. 2020, pp. 764-769. Crossref, doi:10.4028/www.scientific.net/msf.1004.764.

J. Wei et al., "Charge storage effect in SiC trench MOSFET with a floating p-shield and its impact on dynamic performances," 2017 29th International Symposium on Power Semiconductor Devices and IC's (ISPSD), Sapporo, Japan, 2017, pp. 387-390, doi: 10.23919/ISPSD.2017.7988985.

J. Wei et al., "Dynamic Degradation in SiC Trench MOSFET With a Floating p-Shield Revealed With Numerical Simulations," in IEEE Transactions on Electron Devices, vol. 64, No. 6, pp. 2592-2598, Jun. 2017, doi: 10.1109/TED.2017.2697763.

Xuan Li et al., "SiC Trench MOSFET With Integrated Self-Assembled Three-Level Protection Schottky Barrier Diode." IEEE Transactions on Electron Devices, (2018) vol. 65, pp. 347-351; DOI:10.1109/TED.2017.2767904.

Dai, Tian, et al., "Design Optimization of 1.2kV 4H-SiC Trench MOSFET." Materials Science Forum, vol. 963, Trans Tech Publications, Ltd., Jul. 2019, pp. 605-608. Crossref, doi:10.4028/www.scientific.net/msf.963.605.

Tanaka, Rina, et al., "Performance Improvement of Trench-Gate SiC MOSFETs by Localized High-Concentration N-Type Ion Implantation." Materials Science Forum, vol. 1004, Trans Tech Publications, Ltd., Jul. 2020, pp. 770-775. Crossref, doi:10.4028/www.scientific.net/msf.1004.770.

Sampath, Madankumar, et al., "A fully self-aligned SiC trench MOSFET with 0.5 μm channel pitch." The International Conference on Silicon Carbide and Related Materials (ICSCRM), Davos, Switzerland, Sep. 11-16, 2022; pp. 1-8.

Sampath, Madankumar, et al., "Comparison of Single- and Double-Trench UMOSFETs in 4H-SiC." Materials Science Forum, vol. 924, Trans Tech Publications, Ltd., Jun. 2018, pp. 752-755. Crossref, doi:10.4028/www.scientific.net/msf.924.752.

Sampath, Madankumar, et al. "The Imosfet: A Deeply-Scaled Fully-Self-Aligned Trench MOSFET." Materials Science Forum, vol. 1004, Trans Tech Publications, Ltd., Jul. 2020, pp. 751-757. Crossref, doi:10.4028/www.scientific.net/msf.1004.751.

U.S. Patent and Trademark Office, Non-Final Office Action issued in U.S. Appl. No. 18/098,999 on Jul. 14, 2025; 18 pages.

U.S. Patent and Trademark Office, Non-Final Office Action issued in U.S. Appl. No. 18/109,126 on Sep. 24, 2025; 12 pages.

U.S. Patent and Trademark Office, Final Office Action issued in U.S. Appl. No. 18/098,999 on Dec. 3, 2025; 17 pages.

* cited by examiner

FIELD-EFFECT TRANSISTORS WITH A HIGH-TEMPERATURE HARDMASK AND SELF-ALIGNED P-SHIELD

BACKGROUND

The disclosure relates to semiconductor devices and integrated circuit manufacture and, more specifically, to structures for a field-effect transistor and methods of forming a structure for a field-effect transistor.

Wide bandgap semiconductors, such as silicon carbide, may be used in high-power applications and/or high-temperature applications. Silicon carbide is well suited for power switching because of advantageous properties, such as a high saturated drift velocity, a high critical field strength, an exceptional thermal conductivity, and a significant mechanical strength. A metal-oxide-semiconductor field-effect transistor is a type of gate-voltage-controlled power switching device that uses field inversion as a current control mechanism. A metal-oxide-semiconductor field-effect transistor may leverage the favorable properties of a silicon carbide substrate to enable, for example, power converters, motor inverters, and motor drivers that are characterized by high reliability and high efficiency when operating at a high voltage.

Improved structures for a field-effect transistor and methods of forming a structure for a field-effect transistor are needed.

SUMMARY

In an embodiment of the invention, a structure for a field-effect transistor is provided. The structure comprises a semiconductor substrate including a top surface, a doped region adjacent to the top surface, and a trench that extends through the doped region. The semiconductor substrate comprises a wide bandgap semiconductor material. The structure further comprises a gate structure including a gate conductor layer in the trench, and a dielectric layer on the top surface of the semiconductor substrate. The dielectric layer includes an opening that is aligned with the trench in the semiconductor substrate, and the dielectric layer comprises a material with a melting point that is greater than or equal to 2000° C.

In an embodiment of the invention, a method of forming a structure for a field-effect transistor is provided. The method comprises forming a doped region adjacent to the top surface of the semiconductor substrate, forming a dielectric layer on the top surface of the semiconductor substrate, and forming an opening in the dielectric layer. The semiconductor substrate comprises a wide bandgap semiconductor material, and the dielectric layer comprises a material with a melting point that is greater than or equal to 2000° C. The method further comprises forming a trench in the semiconductor substrate that extends through the doped region and forming a gate conductor layer of a gate structure in the trench. The opening in the dielectric layer is aligned with the trench in the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
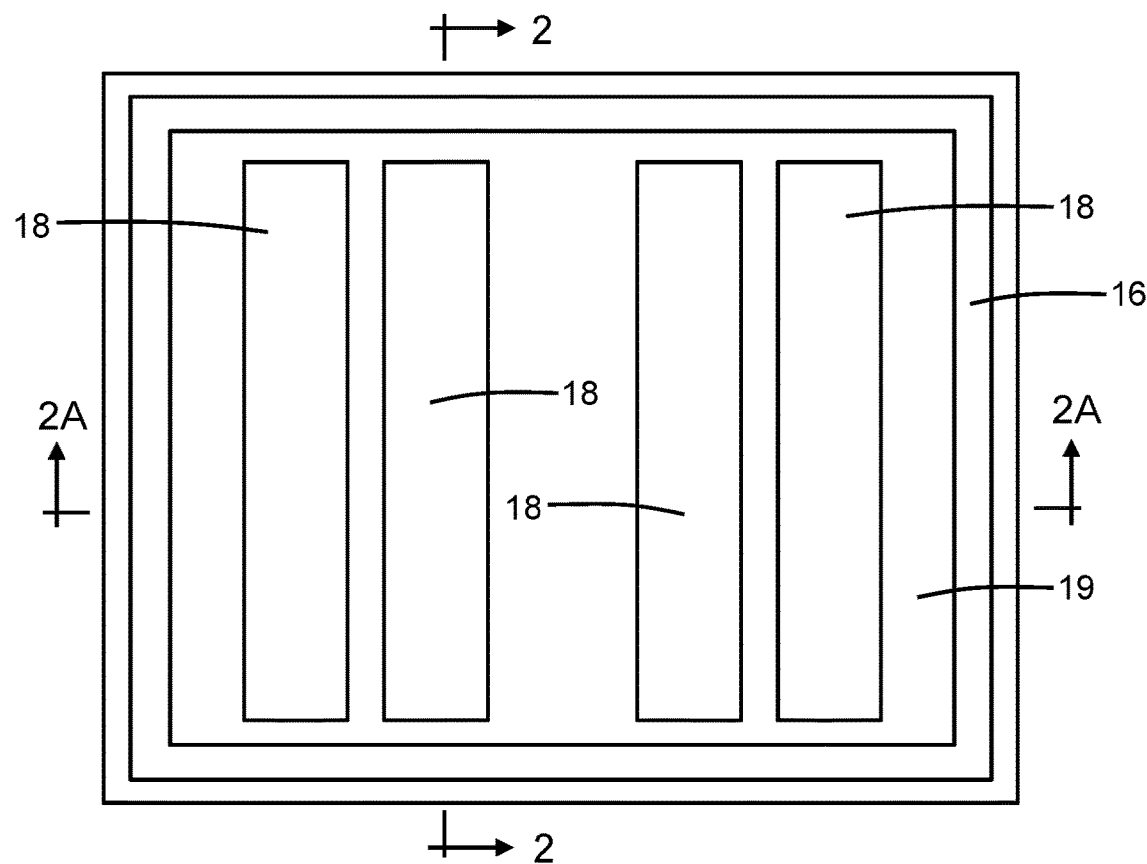
FIG. 1 is a top view of a structure at an initial fabrication stage of a processing method in accordance with embodiments of the invention.
Figure 2:
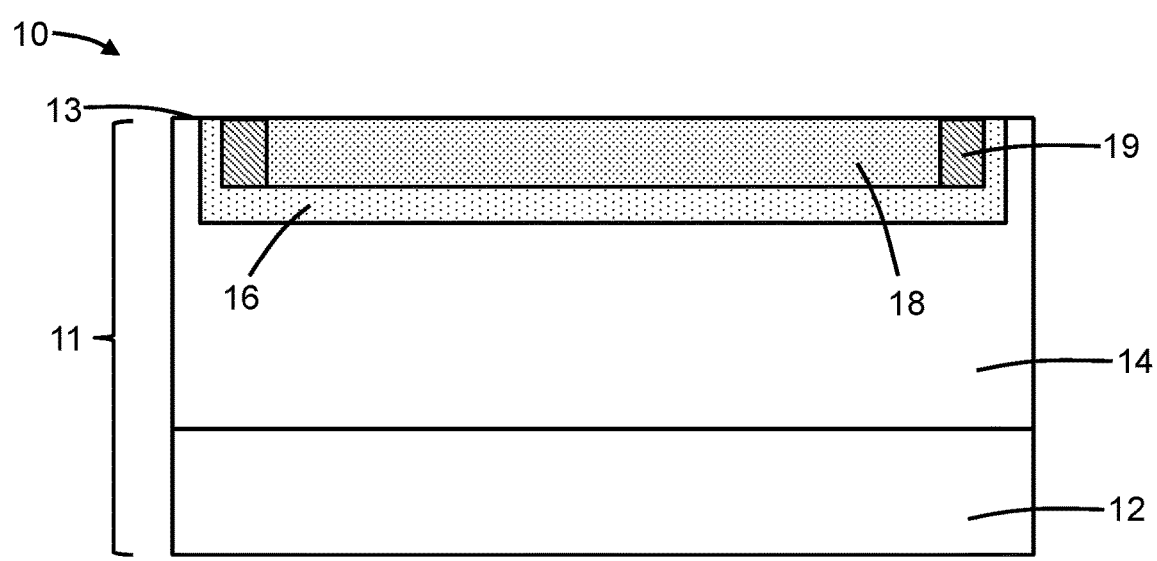
FIG. 2 is a cross-sectional view taken generally along line 2-2 in FIG. 1.
Figure 2A:
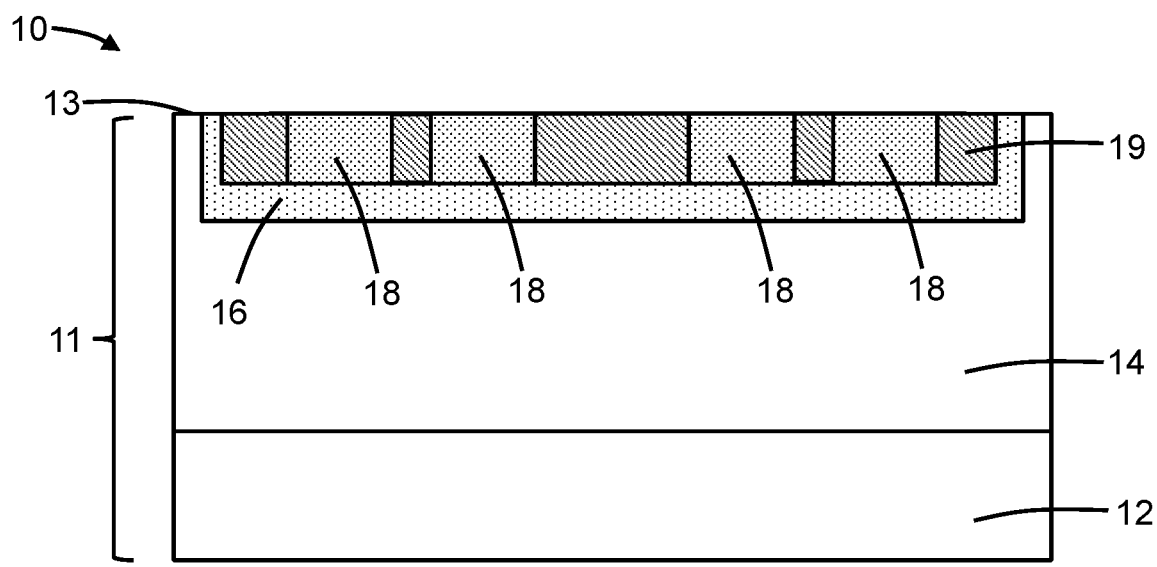
FIG. 2A is a cross-sectional view taken generally along line 2A-2A in FIG. 1.
Figure 3:
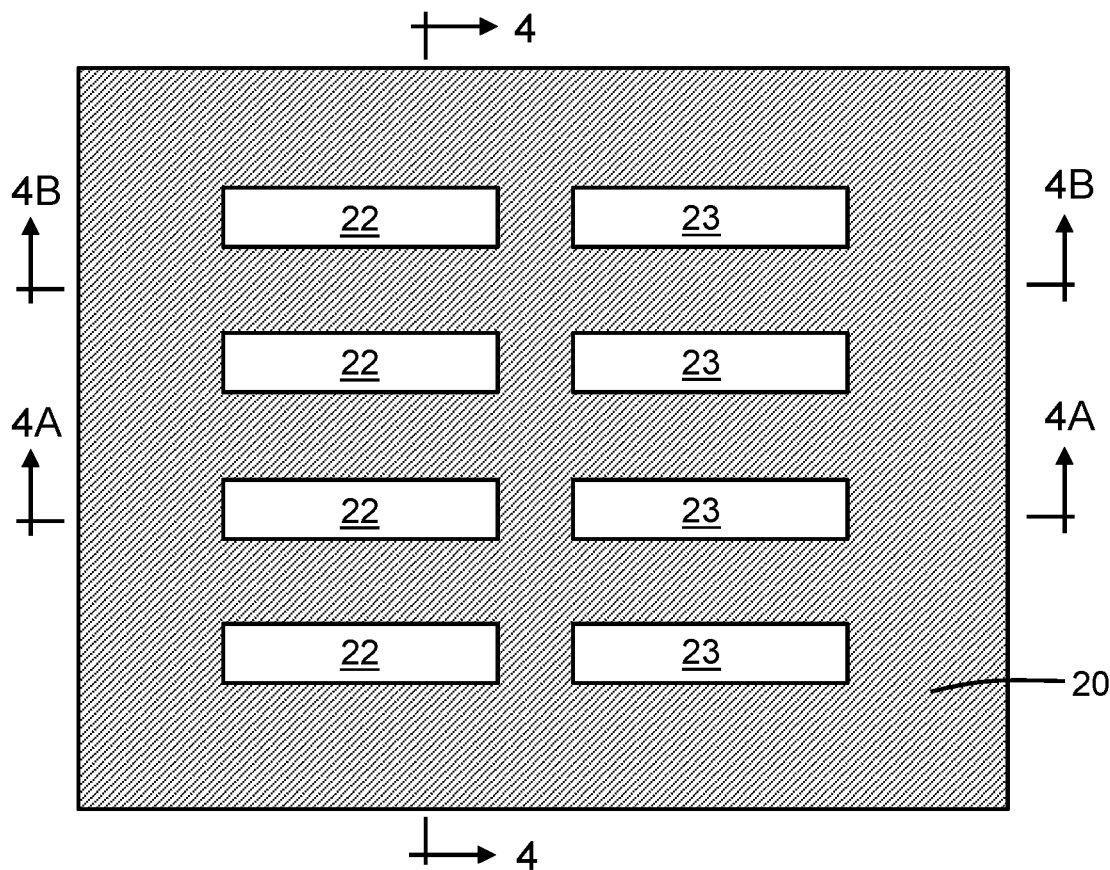
FIG. 3 is a top view of the structure at a fabrication stage subsequent to FIG. 1.

With reference to FIGS. 1, 2, 2A and in accordance with embodiments of the invention, a structure 10 for a field-effect transistor may be formed using a semiconductor substrate 11 that includes a bulk substrate 12 and a semiconductor layer 14 formed by, for example, epitaxial growth on the bulk substrate 12. In an embodiment, the semiconductor layer 14 of the semiconductor substrate 11 may be comprised of a wide bandgap semiconductor material. In an embodiment, the bulk substrate 12 of the semiconductor substrate 11 may be comprised of a wide bandgap semiconductor material. In an embodiment, the bulk substrate 12 and the semiconductor layer 14 may be comprised of silicon carbide, which is a wide bandgap semiconductor material. In an embodiment, the bulk substrate 12 and the semiconductor layer 14 may be comprised of diamond, which is a wide bandgap semiconductor material. In an embodiment, the bulk substrate 12 and the semiconductor layer 14 may be comprised of a semiconductor material having a melting point greater than the melting point of silicon. In an embodiment, the bulk substrate 12 and the semiconductor layer 14 may be comprised of silicon carbide that is doped to have n-type electrical conductivity. In an embodiment, the bulk substrate 12 and the semiconductor layer 14 may be comprised of silicon carbide that is doped to have n-type electrical conductivity with the bulk substrate 12 having a higher dopant concentration and a lower electrical resistivity than the semiconductor layer 14. In an embodiment, the bulk substrate 12 may have a resistivity of less than 25 mOhm-cm. In an embodiment, the semiconductor layer 14 may include a buffer sublayer grown directly on the bulk substrate 12 and a drift sublayer grown on the buffer sublayer, and the drift sublayer may have a dopant concentration and a thickness that are optimized for device operation in a 650 volt to 1200 volt range. In an embodiment, the bulk substrate 12 may operate as the drain of the field-effect transistor and may be contacted at the backside of the bulk substrate 12.

A doped region 16 may be formed in the semiconductor layer 14 adjacent to a top surface 13 of the semiconductor substrate 11. The doped region 16 is doped to have an opposite conductivity type from the semiconductor layer 14. The doped region 16 has a lower boundary that defines an interface with the underlying semiconductor material of the semiconductor layer 14 across which the dopant type changes. In an embodiment, the doped region 16 may define a body of the field-effect transistor.

The doped region 16 may be formed by introducing a dopant of a given conductivity type by, for example, ion implantation into the semiconductor layer 14. An implantation mask may be formed to define a selected area on a top surface 13 of the semiconductor substrate 11 that is exposed for the implantation of ions. The implantation mask may include a hardmask that is applied and patterned to form an opening exposing the selected area on the top surface 13 and determining, at least in part, the location and horizontal dimensions of the doped region 16. The implantation conditions (e.g., ion species, dose, kinetic energy, substrate temperature) may be selected to tune the electrical and physical characteristics of the doped region 16, to minimize defects, and to maximize the ionization and activation of the implanted dopants. In an embodiment, the ion implantation may be performed at substrate temperature in a range of 200° C. to 600° C. to minimize defect formation. The implantation mask, which is compatible with the implantation conditions and is stripped following implantation, has a thickness and stopping power sufficient to block the implantation of ions in masked areas. In an embodiment, the doped region 16 may be doped with a concentration of a p-type dopant (e.g., aluminum) to provide p-type electrical conductivity.

A doped region 19 may be formed in the doped region 16. The doped region 19 may provide a body contact to the body of the field-effect transistor defined by the doped region 16. The doped region 19 may be formed by introducing a dopant of a given conductivity type by, for example, ion implantation into the semiconductor layer 14. An implantation mask may be formed to define a selected area on a top surface 13 of the semiconductor substrate 11 that is exposed for the implantation of ions. The implantation mask may include a hardmask that is applied and patterned to form an opening exposing the selected area on the top surface 13 and determining, at least in part, the location and horizontal dimensions of the doped region 19. The implantation conditions (e.g., ion species, dose, kinetic energy, substrate temperature) may be selected to tune the electrical and physical characteristics of the doped region 19, to minimize defects, and to maximize the ionization and activation of the implanted dopants. In an embodiment, the ion implantation may be performed at substrate temperature in a range of 200° C. to 600° C. to minimize defect formation. The implantation mask, which is compatible with the implantation conditions and is stripped following implantation, has a thickness and stopping power sufficient to block the implantation of ions in masked areas. In an embodiment, the doped region 19 may be doped with a concentration of a p-type dopant (e.g., aluminum) to provide p-type electrical conductivity, and the dopant concentration of the doped region 19 may be greater than the dopant concentration of the doped region 16.

Doped regions 18 may be formed in the semiconductor layer 14 adjacent to a top surface 13 of the semiconductor substrate 11. The doped regions 18, which may be strip shaped, have the same conductivity type as the semiconductor layer 14 but at a higher dopant concentration. Each doped region 18 has an upper boundary that may be coplanar or substantially coplanar with the top surface 13 of the semiconductor substrate 11 and a lower boundary that defines an interface with the doped region 16 across which the conductivity type changes. In an embodiment, the doped regions 18 may define a source of the field-effect transistor.

The doped regions 18 may be formed by introducing a dopant of a given conductivity type by, for example, ion implantation into the semiconductor layer 14. An implantation mask may be formed to define a selected area on a top surface 13 of the semiconductor substrate 11 that is exposed for the implantation of ions. The implantation mask may include a hardmask that is applied and patterned to form an opening exposing the selected area on the top surface 13 of the semiconductor substrate 11 and determining, at least in part, the location and horizontal dimensions of the doped regions 18. The implantation conditions (e.g., ion species, dose, kinetic energy, substrate temperature) may be selected to tune the electrical and physical characteristics of the doped regions 18. In an embodiment, the ion implantation may be performed at substrate temperature in a range of 200° C. to 600° C. to minimize defect formation. The implantation mask, which is compatible with the implantation conditions and is stripped following implantation, has a thickness and stopping power sufficient to block the implantation of ions in masked areas. In an embodiment, the doped regions 18 may be doped (e.g., heavily doped) with a concentration of an n-type dopant (e.g., nitrogen and/or phosphorus) to provide n-type electrical conductivity. In an embodiment, the doped regions 18 may be doped with a higher concentration of the n-type dopant than the semiconductor layer 14.

With reference to FIGS. 3, 4, 4A, 4B in which like reference numerals refer to like features in FIGS. 1, 2, 2A and at a subsequent fabrication stage, a dielectric layer 20 is applied on the top surface 13 of the semiconductor substrate 11 and, in particular, the dielectric layer 20 may be disposed on the top surface 13 over the doped regions 16, 18, 19. The dielectric layer 20 may be comprised of a material that is characterized by a high melting point greater than or equal to 2000° C. In an embodiment, the dielectric layer 20 may be comprised of a dielectric material that is an electrical insulator and that is characterized by a melting point greater than or equal to 2000° C. In an embodiment, the dielectric layer 20 may be comprised of a material that is an electrical insulator and that is characterized by a melting point greater than or equal to 2000° C. In an embodiment, the dielectric layer 20 may be comprised of a material that is an insulating ceramic having a melting point greater than or equal to 2000° C. In an embodiment, the dielectric layer 20 may be comprised of a material that is a high-resistivity semiconductor material having a melting point greater than or equal to 2000° C. In an embodiment, the dielectric layer 20 may be comprised of a material characterized by a coefficient of thermal expansion that is similar to the coefficient of thermal expansion of crystalline silicon carbide.

In an embodiment, the dielectric layer 20 may be comprised of aluminum nitride. In an embodiment, the dielectric layer 20 may be comprised of polycrystalline silicon carbide. In embodiments, the dielectric layer 20 may include multiple sublayers each comprised of a material that is characterized by a melting point greater than or equal to 2000° C. In an embodiment, the dielectric layer 20 may include a sublayer comprised of either aluminum nitride or polycrystalline silicon carbide that is disposed on a sublayer comprised of aluminum oxide. In an embodiment, the dielectric layer 20 may include a sublayer comprised of polycrystalline silicon carbide that is disposed on a sublayer comprised of aluminum nitride. The total thickness of the dielectric layer 20 may be equal to a sum of the individual thicknesses of the sublayers.

Trenches 22, 23 are formed by lithography and etching processes that extend into the semiconductor substrate 11. More specifically, each of the trenches 22, 23 extends from the top surface 13 of the semiconductor substrate 11 through the doped regions 16, 18, 19 and into the semiconductor layer 14 beneath the doped region 16. The dielectric layer 20 may function as a hardmask during the formation of the trenches 22, 23. In that regard, the dielectric layer 20 is patterned to define openings 27 that are subsequently used to pattern the trenches 22, 23 and that are aligned with the trenches 22, 23. In an alternative embodiment, a hardmask comprised of a dielectric material, such as silicon dioxide, may be applied on the dielectric layer 20 and patterned to define a hardmask on the dielectric layer 20 that is used during patterning of the semiconductor substrate 11 and removed following the patterning of the trenches 22, 23.

The trenches 22, 23 and the openings 27 in the dielectric layer 20 may be elongated with a length dimension L and a width dimension W1 in a direction transverse to the length dimension L. The trenches 22 may be arranged in a column, the trenches 23 may be arranged in a column, and each trench 22 may be arranged adjacent to one of the trenches 23.

Each of the trenches 22, 23 has sidewalls 24 at the opposite trench sides, sidewalls 25 at the opposite trench ends, and a trench bottom 26 that is positioned between the top surface 13 and the interface between the bulk substrate 12 and the semiconductor layer 14. The sidewalls 24 may be oriented parallel to the length L of the trenches 22, 23, and the sidewalls 25 may be oriented parallel to the width W1 of the trenches 22, 23. The length L of the trenches 22, 23 may be measured between the sidewalls 25 at the opposite trench ends. The sidewalls 24 may adjoin the sidewalls 25, and the sidewalls 24, 25 may extend from the trench bottoms 26 to the top surface 13. In contrast to conventional process flows, the dielectric layer 20 is not removed from the top surface 13 after the trenches 22, 23 are formed.

A doped region 28 may be formed in the semiconductor layer 14 beneath and adjacent to the trench bottom 26 of each of the trenches 22, 23. The doped regions 28 are positioned in a vertical direction between the trenches 22, 23 and the bulk substrate 12 operating as the drain of the field-effect transistor. The doped regions 28 have an opposite conductivity type from the semiconductor layer 14 and the doped region 16. The doped regions 28, which are formed after forming the trenches 22, 23 and are self-aligned to the trenches 22, 23, may define p-shields of the field-effect transistor. Each doped region 28 may have a width dimension that is equal or substantially equal to the width dimension W1 and a length dimension that is equal or substantially equal to the length dimension L.

The doped regions 28 may be formed by introducing a dopant of a given conductivity type by, for example, ion implantation into the semiconductor layer 14. The trenches 22, 23 in the dielectric layer 20 may determine, at least in part, the location and horizontal dimensions of the doped regions 28. The dielectric layer 20 has a thickness and stopping power sufficient to block the implantation of ions in masked areas. The implantation conditions (e.g., ion species, dose, kinetic energy, substrate temperature, tilt angle) may be selected to tune the electrical and physical characteristics of the doped regions 28. In an embodiment, the ion implantation may be performed at substrate temperature in a range of 200° C. to 600° C. to minimize defect formation. In an embodiment, the doped regions 28 may be doped with a concentration of a p-type dopant (e.g., aluminum) to provide p-type electrical conductivity. In an embodiment, the doped regions 28 may be formed with a tilt angle equal to 0°, which is an orientation for the tilt angle of the semiconductor substrate 11 that aligns the ion trajectories in a direction perpendicular to the top surface 13. Due to the selection of tilt angle, the semiconductor layer 14 is not implanted adjacent to the sidewalls 24, 25 of the trenches 22, 23.

Figure 4:
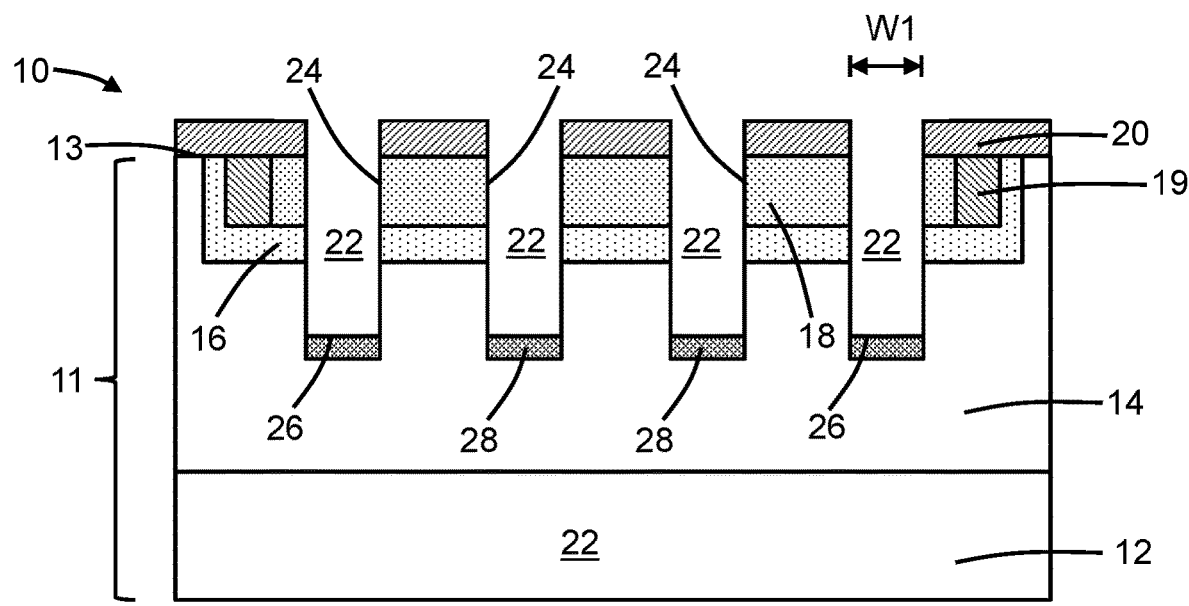
FIG. 4 is a cross-sectional view taken generally along line 4-4 in FIG. 3.
Figure 4A:
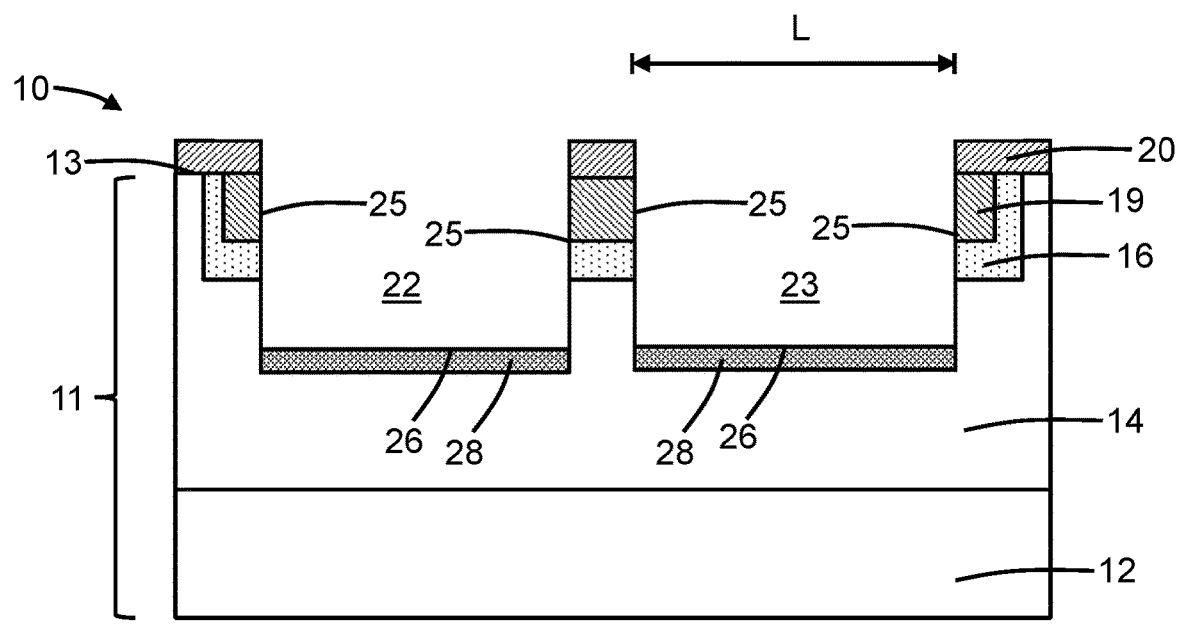
FIG. 4A is a cross-sectional view taken generally along line 4A-4A in FIG. 3.
Figure 4B:
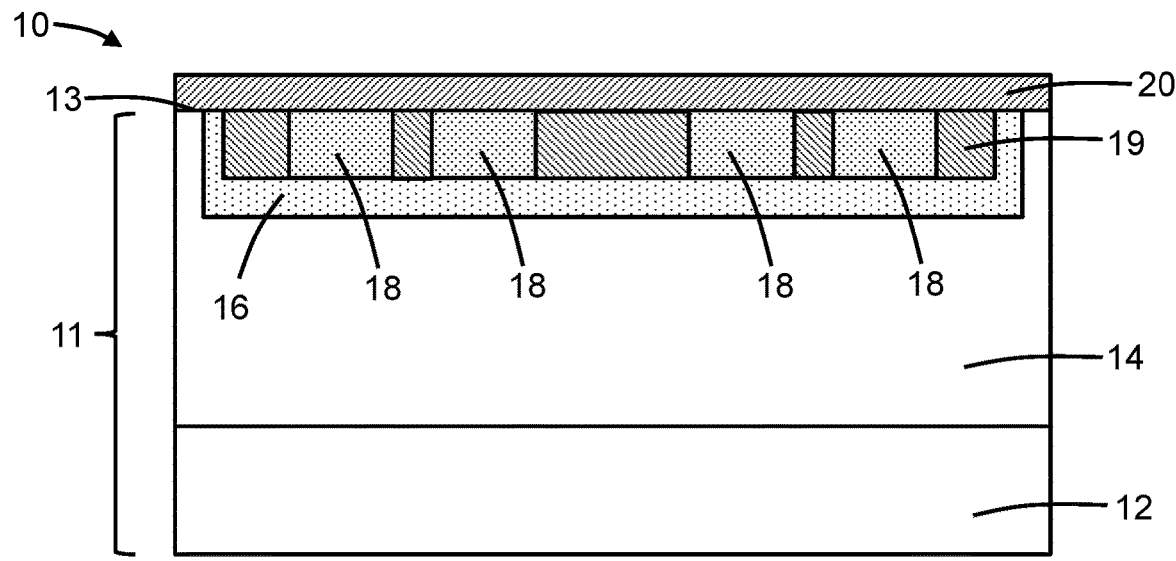
FIG. 4B is a cross-sectional view taken generally along line 4B-4B in FIG. 3.
Figure 5:
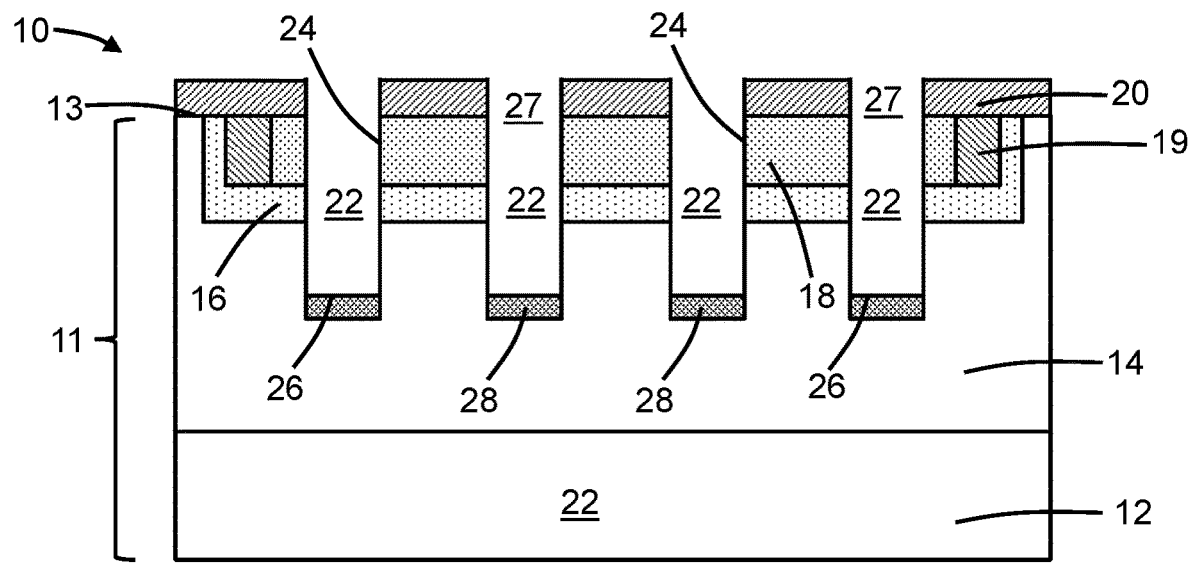
FIGS. 5, 5A, 5B are cross-sectional views of the structure at a fabrication stage subsequent to FIGS. 3, 4, 4A, 4B.
Figure 5A:
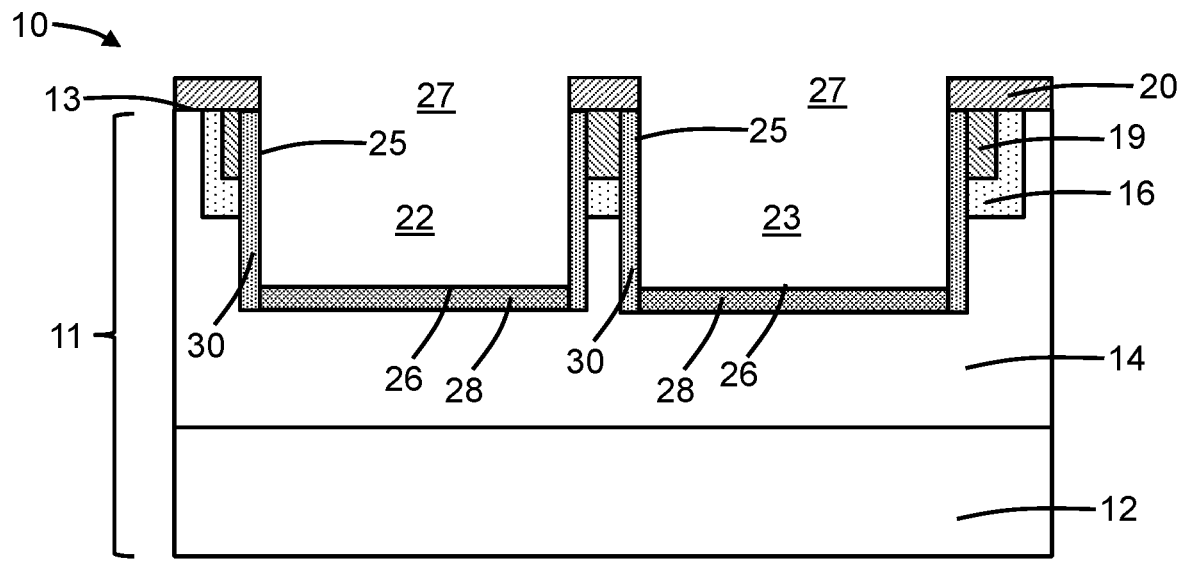
Figure 5B:
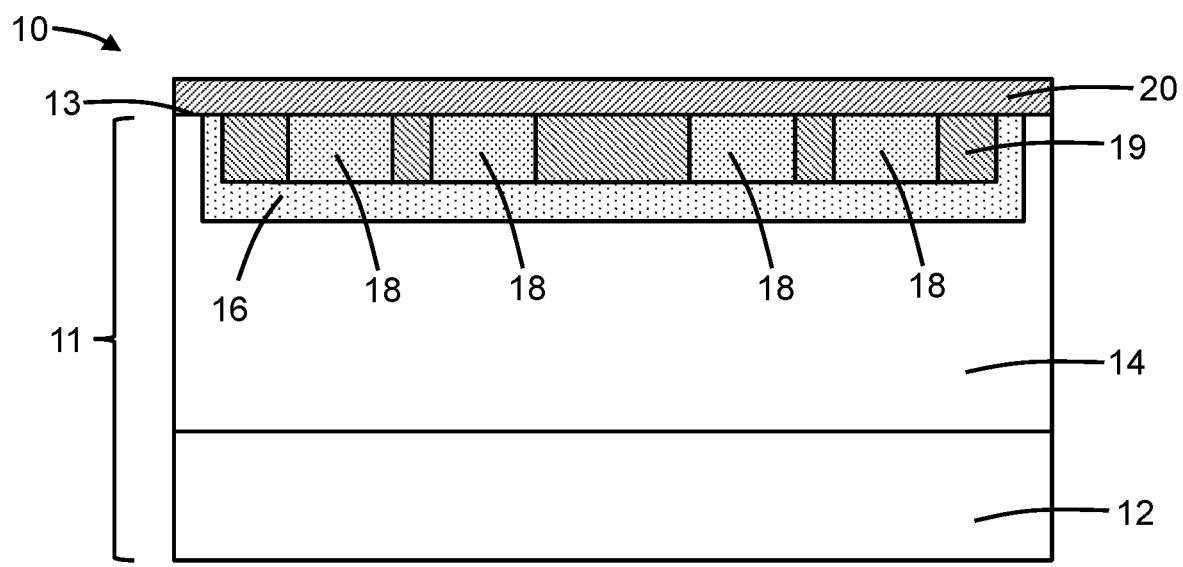

With reference to FIGS. 5, 5A, 5B in which like reference numerals refer to like features in FIGS. 4, 4A, 4B and at a subsequent fabrication stage, a doped region 30 may be formed in the semiconductor layer 14 adjacent to the sidewalls 25 of each of the trenches 22, 23. The doped regions 30 define conductive paths leading from the doped regions 28 to the top surface 13. The doped regions 30 have the same conductivity type as the doped regions 28, the doped region 16, and the doped region 19, and an opposite conductivity type from the semiconductor layer 14 and the doped region 16. The doped regions 30 may define p-shield contacts of the field-effect transistor.

The doped regions 30 may be formed by introducing a dopant of a given conductivity type by, for example, ion implantation into the semiconductor layer 14. The dielectric layer 20 has a thickness and stopping power sufficient to block the implantation of ions in masked areas. The implantation conditions (e.g., ion species, dose, kinetic energy, substrate temperature, tilt angle) may be selected to tune the electrical and physical characteristics of the doped regions 30. In an embodiment, the doped regions 30 may be doped with a concentration of a p-type dopant (e.g., aluminum) to provide p-type electrical conductivity. In an embodiment, the ion implantation may be performed at substrate temperature in a range of 200° C. to 600° C. to minimize defect formation. In an embodiment, the doped regions 30 may be formed by a first implantation with a non-zero tilt angle in a range of 5° to 15° and the semiconductor substrate 11 aligned with a fixed rotational angle such that the ion trajectories are directed into the sidewall 25 at one end of each of the trenches 22, 23, and then a second implantation with a non-zero tilt angle in a range of 5° to 15° and the semiconductor substrate 11 may be rotated by 180° to a different fixed rotational angle such that the ion trajectories are directed into the sidewall 25 at an opposite end of each of the trenches 22, 23. Due to the selection of the fixed rotational angles for the semiconductor substrate 11, the semiconductor layer 14 is not implanted adjacent to the sidewalls 24 of the trenches 22, 23.

A high-temperature anneal may be performed following the implantations to activate the implanted dopants and to alleviate post-implantation crystal damage. The high-temperature anneal may be performed with a removable carbon capping layer applied as a temporary coating on the dielectric layer 20 and at a high temperature, such as a temperature in a range of 1600° C. to 1900° C. The dielectric layer 20, which can withstand the high anneal temperature, is disposed on the top surface 13 during the anneal and functions to enhance the surface protection during the anneal. The removable carbon capping layer may prevent silicon outgassing from surface areas, such as those surface areas inside the trenches 22, 23, that are not covered and protected by the dielectric layer 20 during the high-temperature anneal. The carbon capping layer, which may be comprised of burned photoresist or a deposited layer of carbon, is removed following the high-temperature anneal.

Figure 6:
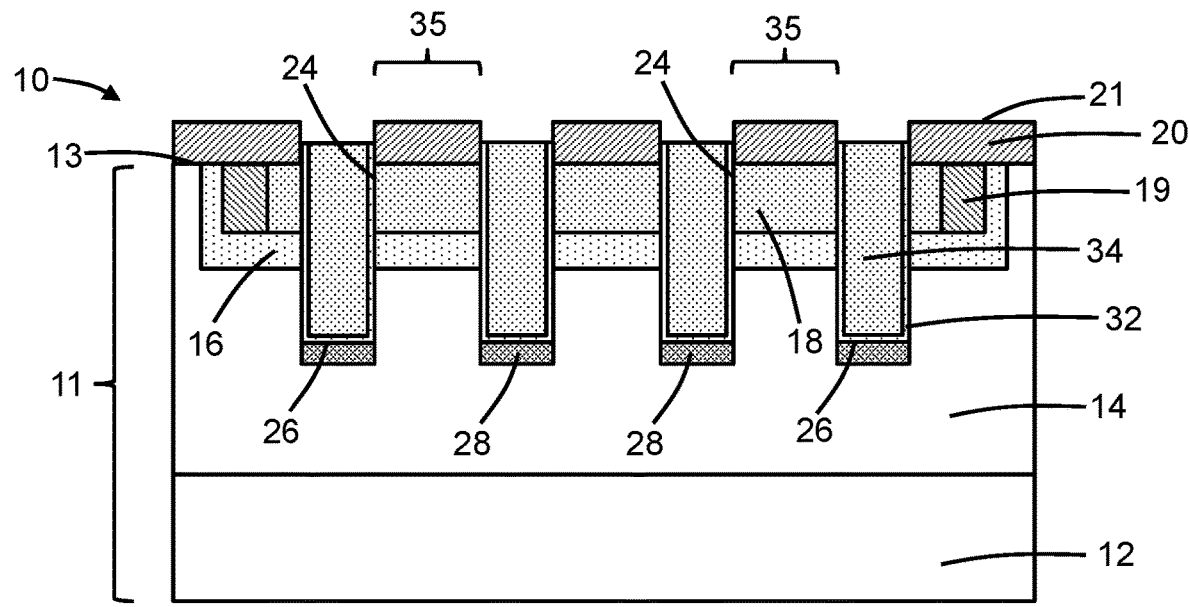
FIGS. 6, 6A, 6B are cross-sectional views of the structure at a fabrication stage subsequent to FIGS. 5, 5A, 5B.
Figure 6A:
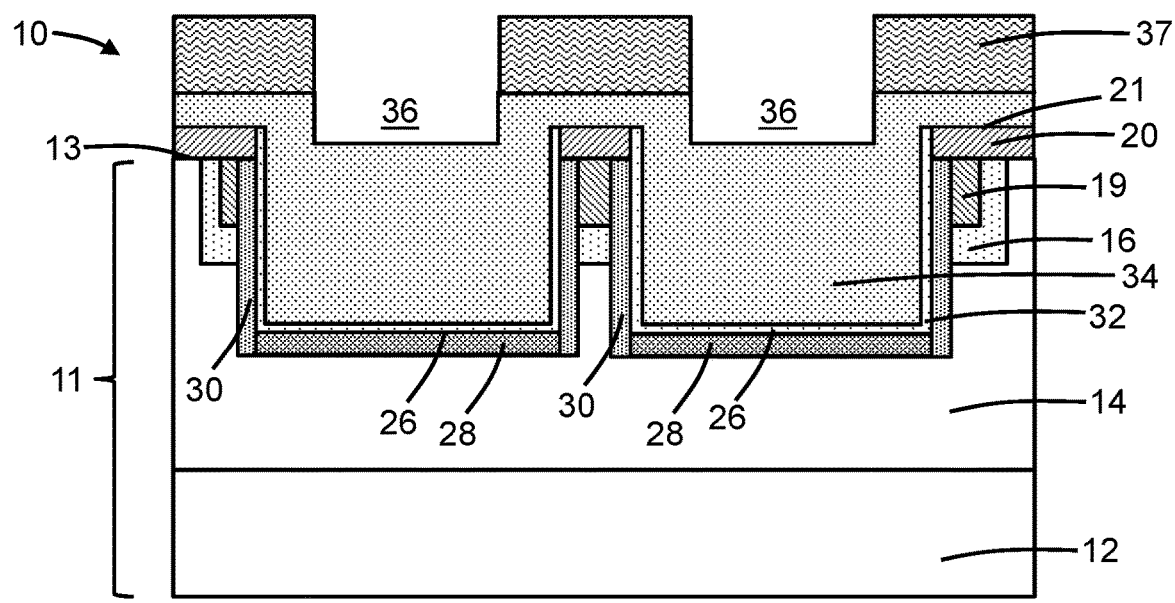
Figure 6B:
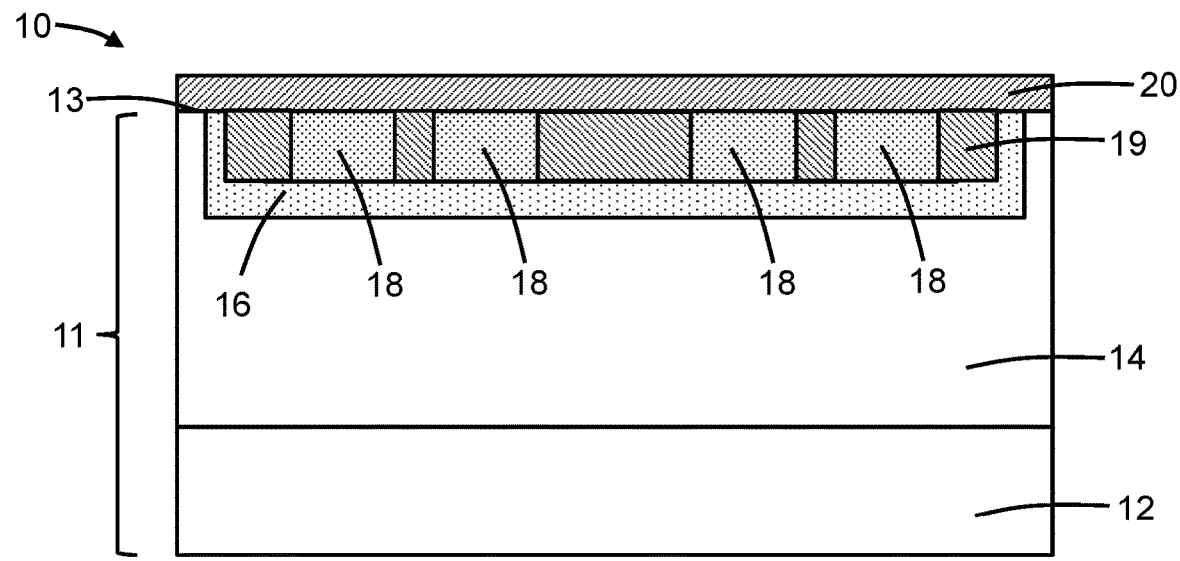

With reference to FIGS. 6, 6A, 6B in which like reference numerals refer to like features in FIGS. 5, 5A, 5B and at a subsequent fabrication stage, a gate dielectric layer 32 and a gate conductor layer 34 are deposited and patterned with lithography and etching processes. A gate structure is defined by portions of the gate dielectric layer 32 and gate conductor layer 34 inside each of the trenches 22, 23, and other portions of the gate conductor layer 34 interconnect the portion of the gate conductor layer 34 in each trench 22 and the portion of the gate conductor layer 34 in the adjacent trench 23. In an embodiment, the gate conductor layer 34 may be comprised of polysilicon or amorphous silicon that is heavily doped with an n-type dopant, such as phosphorus or arsenic, and the gate dielectric layer 32 may be comprised of a dielectric material, such as silicon dioxide, that is an electrical insulator.

Portions of the gate conductor layer 34 are removed by the patterning from the top surface 13, which includes the removal of portions of the gate conductor layer 34 from the spaces between the sidewalls 24 of the trenches 22 and from the spaces between the sidewalls 24 of the trenches 23 to define gate fingers. An etch mask 37 may cover the non-removed portions of the gate conductor layer 34. Each gate finger includes the portion of the gate conductor layer 34 in one of the trenches 22, the portion of the gate conductor layer 34 in the adjacent trench 23, and the portion of the gate conductor layer 34 extending across the space between these portions in the adjacent trenches 22, 23. The gate fingers may be longitudinally aligned either parallel or substantially parallel to each other, and each gate finger may extend to a transversely-oriented portion (not shown) of the gate conductor layer 34 on which gate contacts may be landed. The dielectric layer 20, which is present on the top surface 13, assists with self-alignment during the formation of the gate structures in the trenches 22, 23. The gate dielectric layer 32 and gate conductor layer 34 of each gate structure project in a vertical direction above the top surface 13 due to the existence of the upper portions of the trenches 22, 23 in the dielectric layer 20.

The structure 10 includes channel regions 35 that are disposed as portions of the doped region 16 on both sides of the trenches 22, 23. More specifically, a channel region 35 is disposed in the doped region 16 between the sidewalls 24 of adjacent pairs of trenches 22, and a channel region 35 is disposed in the doped region 16 between the sidewalls 24 of adjacent pairs of trenches 23 below the doped region 18. The multiple channel regions 35 may operate to minimize the drain-source on resistance per area of the field-effect transistor.

Recesses 36 may be formed in the portions of the gate conductor layer 34 inside the trenches 22, 23. The recesses 36 may be formed during patterning by including openings in the etch mask 37 that are disposed over the portions of the gate conductor layer 34 inside the trenches 22, 23. In an embodiment, the top surface of each gate conductor layer 34 inside each recess 36 may be disposed in a vertical direction between the top surface 21 of the dielectric layer 20 and the top surface 13 of the semiconductor substrate 11. Each gate conductor layer 34 may have upper and lower portions that are disposed in a vertical direction on opposite sides of the top surface 13 of the semiconductor substrate 11.

Figure 7:
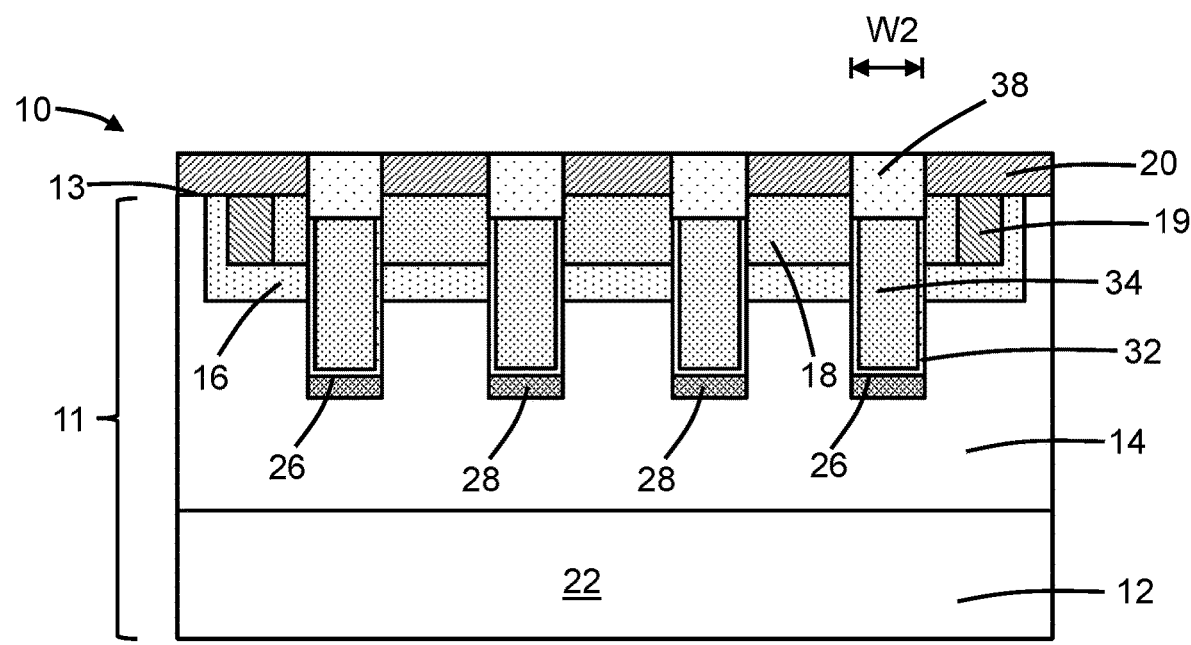
FIGS. 7, 7A, 7B are cross-sectional views of the structure at a fabrication stage subsequent to FIGS. 6, 6A, 6B.
Figure 7A:
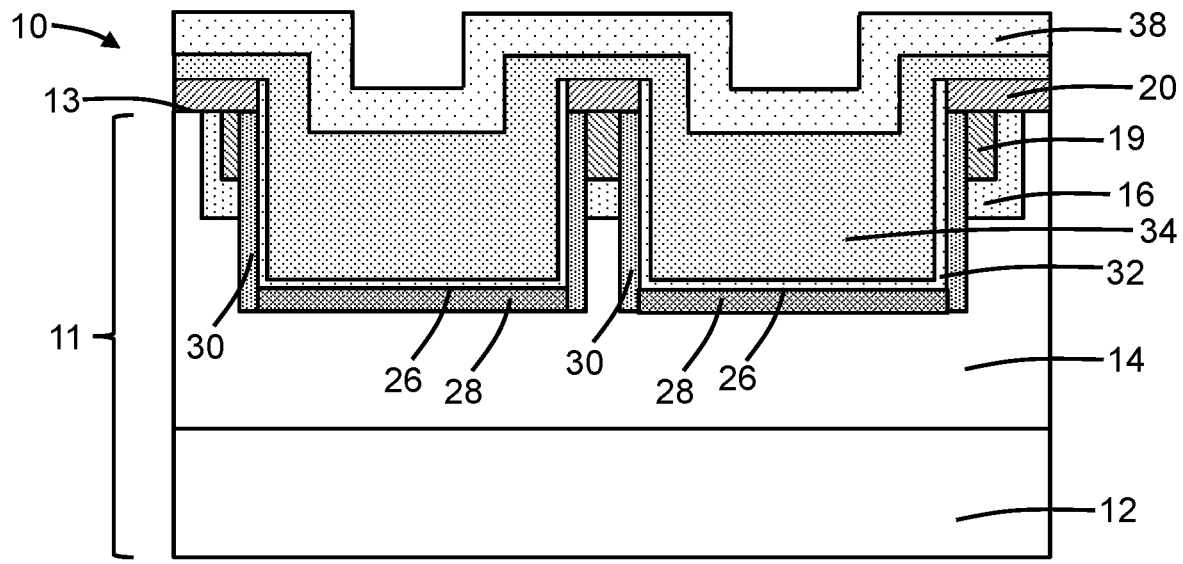
Figure 7B:
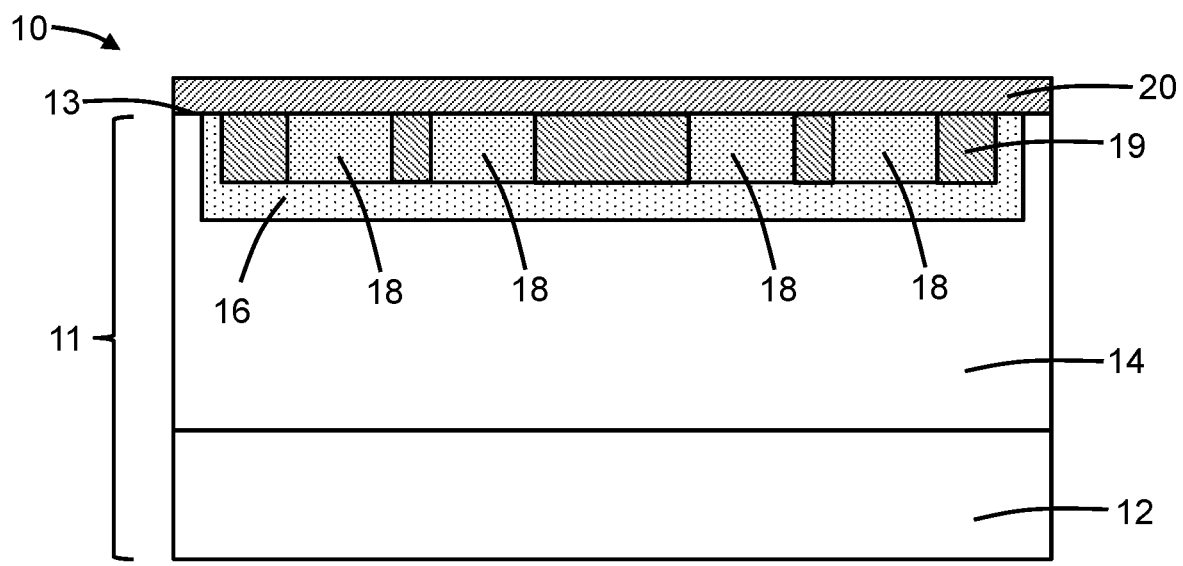

With reference to FIGS. 7, 7A, 7B in which like reference numerals refer to like features in FIGS. 6, 6A, 6B and at a subsequent fabrication stage, a dielectric layer 38 is formed on each of the gate conductor layers 34. The dielectric layers 38 may be comprised of a dielectric material, such as silicon dioxide, that is an electrical insulator. In an embodiment, the dielectric layers 38 be formed by oxidizing the material of the gate conductor layers 34 with a thermal oxidation process. The oxidation temperature may be selected in order to maximize the oxidation of the material constituting the gate conductor layers 34 and to minimize the oxidation of surrounding materials, such as the material of the dielectric layer 20.

A portion of one of the dielectric layers 38 is disposed over the gate dielectric layer 32 and the gate conductor layer 34 of the gate structures inside the trenches 22, 23 and the openings 27 over the trenches 22, 23. The dielectric layer 20 may promote an increase in the thickness of the dielectric layers 38. The dielectric layers 38 may include divots at the locations of the recesses 36 in the gate conductor layers 34 of the gate structures in the trenches 22, 23. The dielectric layers 38 may have a width dimension W2 that is equal or substantially equal to the width dimension W1 of the openings 27 in the dielectric layer 20.

Figure 8:
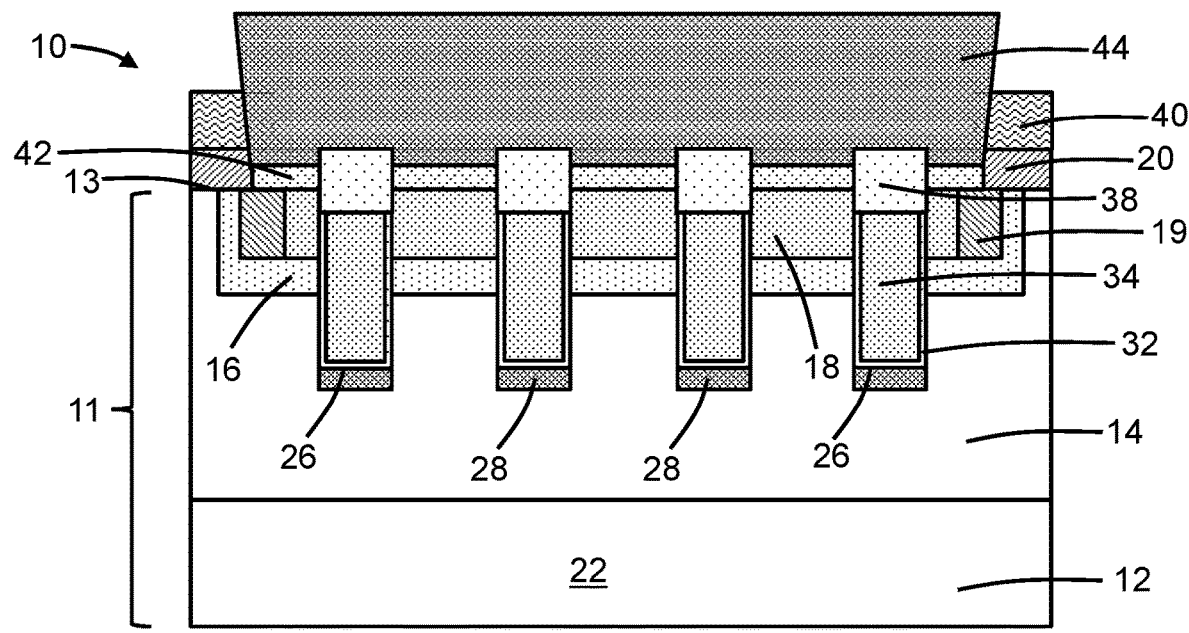
FIGS. 8, 8A, 8B are cross-sectional views of the structure at a fabrication stage subsequent to FIGS. 7, 7A, 7B.
Figure 8A:
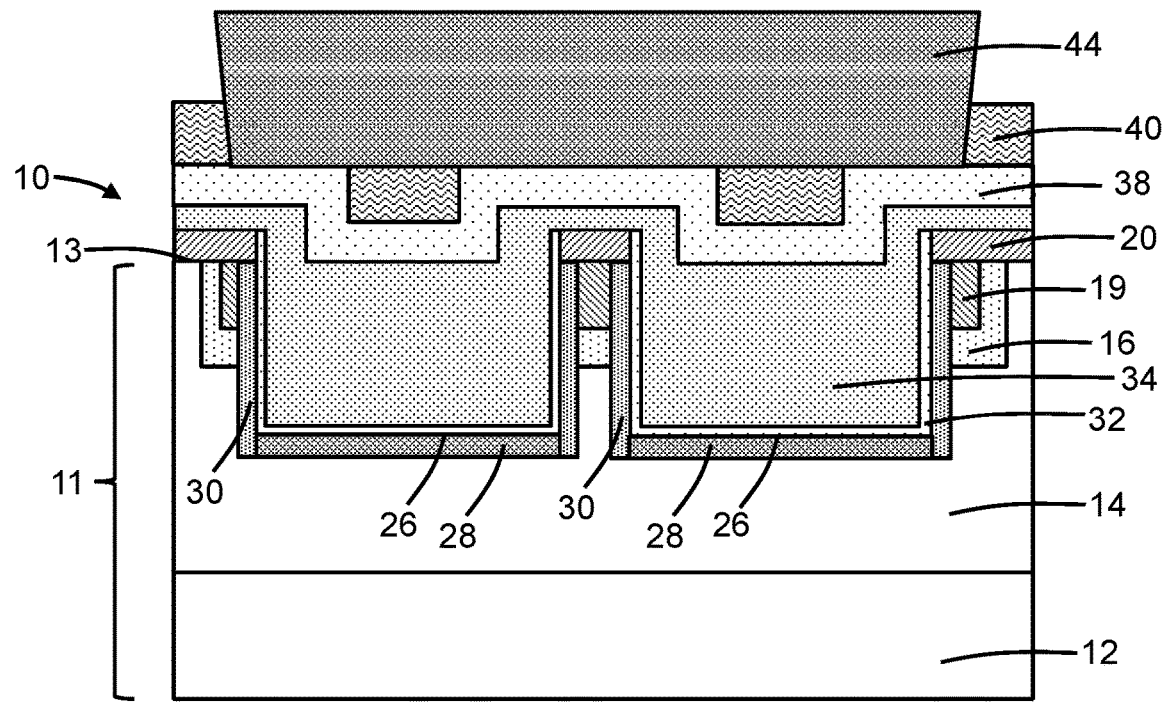
Figure 8B:
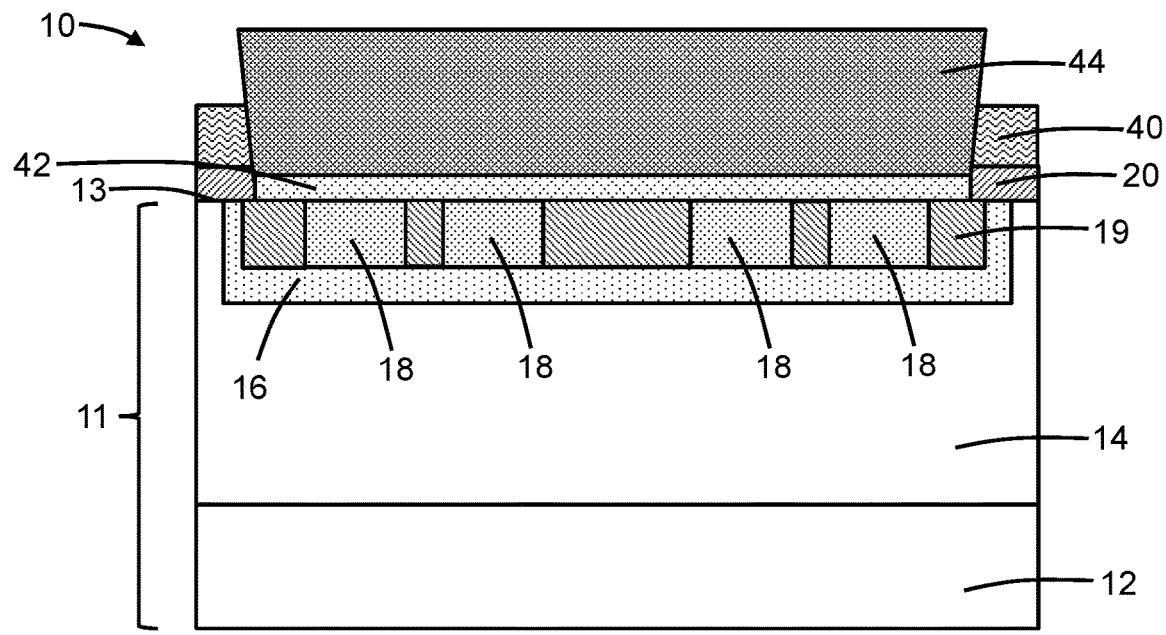

With reference to FIGS. 8, 8A, 8B in which like reference numerals refer to like features in FIGS. 7, 7A, 7B and at a subsequent fabrication stage, one or more dielectric layers 40 may be deposited on the top surface 13. Portions of the one or more dielectric layers 40 may fill the divots in the dielectric layers 38. The one or more dielectric layers 40 may include an etch stop layer comprised of, for example, silicon nitride, and an interlayer dielectric layer comprised of, for example, silicon dioxide. The one or more dielectric layers 40 and the dielectric layer 20 are patterned with lithography and etching processes to define openings extending to the top surface 13 for contacting the doped region 16 via the doped region 19.

Silicide layers 42 are formed by a silicidation process on the areas of the top surface 13 revealed inside the openings. The silicide layers 42 may be comprised of a metal, such as nickel. Contacts 44 comprised of, for example, aluminum may be formed that are coupled by the silicide layer 42 to the doped region 19 and doped region 16. The dielectric layers 38 electrically isolate the contacts 44 from the gate conductor layers 34.

The structure 10 includes self-aligned p-shield contacts defined by the doped regions 30, which are formed by tilted sidewall implants into the trenches 22, 23 in which the gate structures are subsequently formed. The tilted sidewall implants are performed with the semiconductor substrate 11 rotated such that the sidewalls 25 are exposed to the ion trajectories and the sidewalls 24 are oriented tangential to the ion trajectories. Forming the p-shield contacts with tilted implants into the sidewalls 25 of the trenches 22, 23 eliminates the need for high-energy implants. The high-temperature dielectric layer 20, which operates as a hardmask and is not removed following the implant anneal, enables the portions of the dielectric layer 38 over the gate structures to be thickened and enhances electrical isolation. The structure 10 includes trenches 22, 23 in which the gate structures are formed, but lacks similar trenches for the source.

Figure 9:
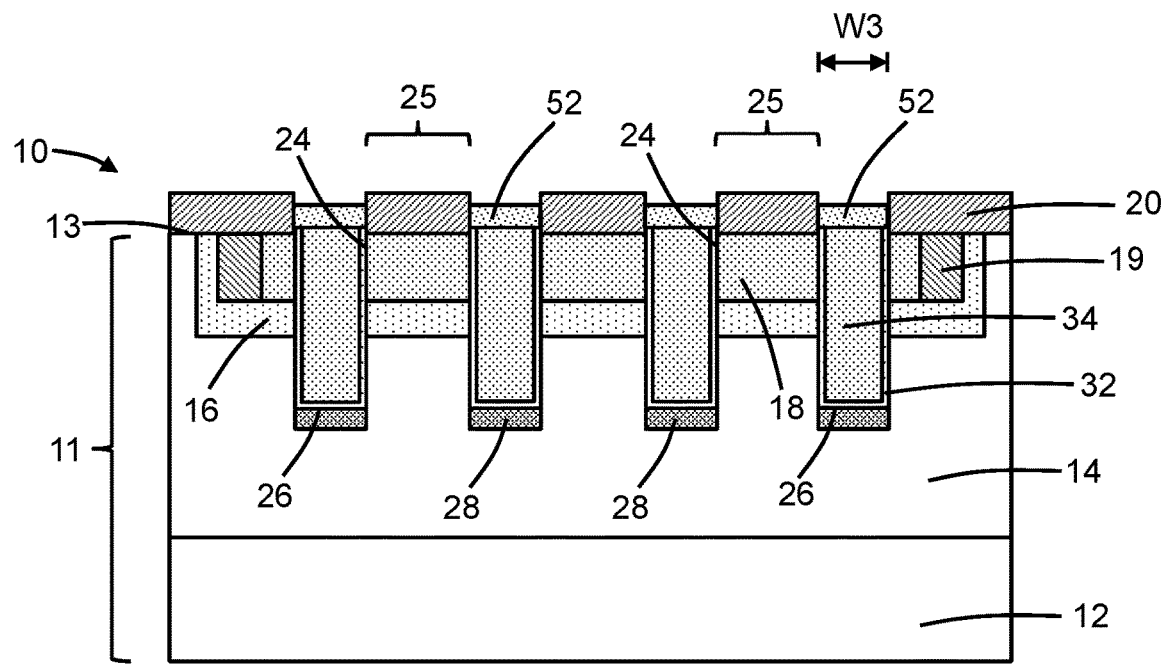
FIGS. 9, 9A, 9B are cross-sectional views of a structure in accordance with alternative embodiments of the invention.
Figure 9A:
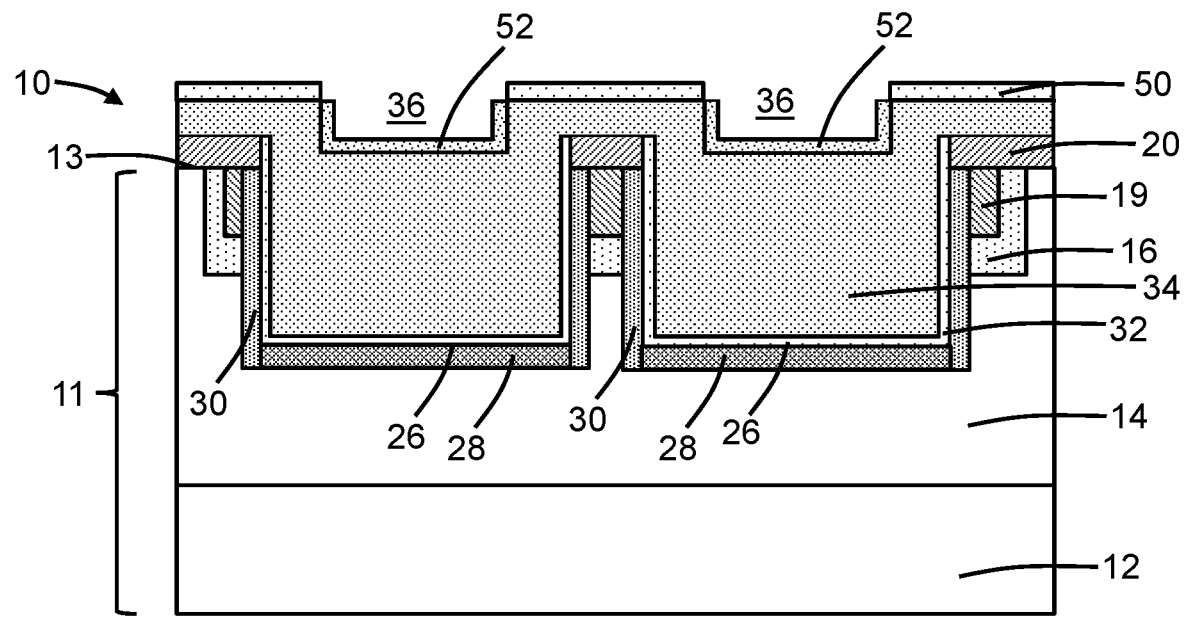
Figure 9B:
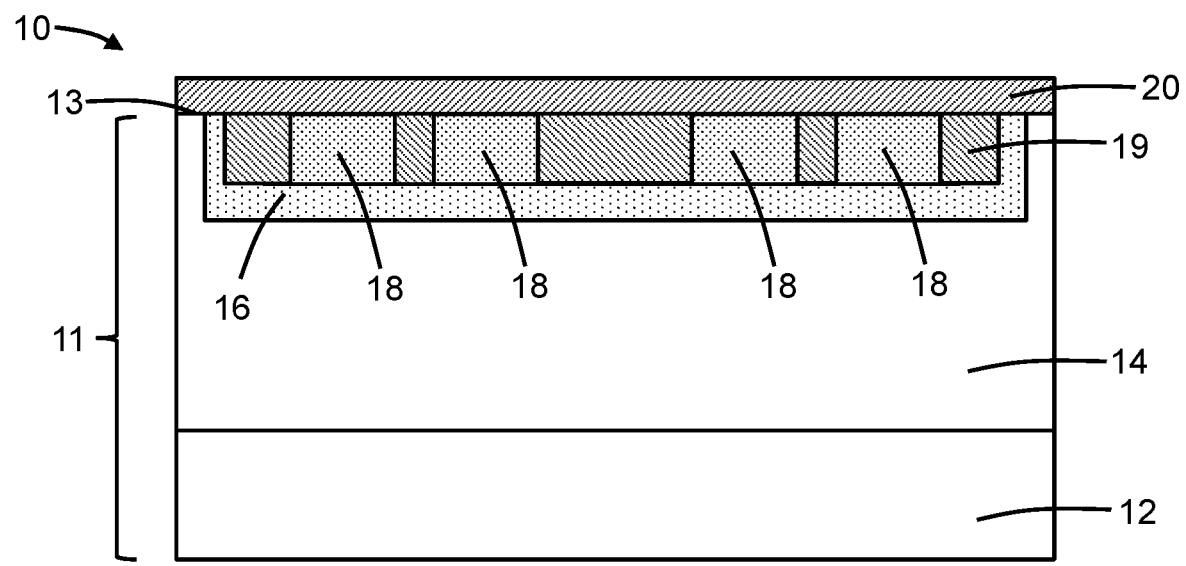

With reference to FIGS. 9, 9A, 9B and in accordance with alternative embodiments, a dielectric layer 50 may be formed and patterned such that the dielectric layer 50 covers the top surface of the gate conductor layer 34 other than at the locations of the recesses 36. In an embodiment, the dielectric layer 50 may be comprised of a dielectric material, such as silicon dioxide, that is deposited and patterned, or formed by thermal oxidation of the gate conductor layers 34. Silicide layers 52 may be formed by a silicidation process on surface areas of the gate conductor layers 34 inside the recesses 36 and effectively on the gate structures inside the trenches 22, 23. In an embodiment, the silicide layers 52 may be disposed above the top surface 13 of the semiconductor substrate 11. The silicide layers 52 may have a width dimension W3 that is equal or substantially equal to the width dimension W1 of the openings 27 in the dielectric layer 20.

In an embodiment, the silicide layers 52 may be formed by depositing a silicide-forming metal, performing one or more annealing steps to form a silicide phase by reacting the silicide-forming metal with the semiconductor material of the gate conductor layers 34, and selectively removing any unreacted silicide-forming metal. The silicide layers 52 may then be subjected to an additional annealing step at a higher temperature to form a lower-resistance silicide phase. In an embodiment, the silicide-forming metal employed to form the silicide layers 52 may be comprised of cobalt or titanium.

In an embodiment, the silicide layers 42 may be formed by depositing a silicide-forming metal, performing one or more annealing steps to form a silicide phase by reacting the silicide-forming metal with the semiconductor material of the gate conductor layers 34, and selectively removing any unreacted silicide-forming metal. The silicide layers 42 may then be subjected to an additional annealing step at a higher temperature to form a lower-resistance silicide phase. In an embodiment, the silicide-forming metal employed to form the silicide layers 42 may be comprised of nickel.

The process flow continues to form a structure 10 shown in FIGS. 9, 9A, 9B that includes the added silicide layers 52 disposed on the gate conductor layers 34 of the gate structures. In the completed structure 10, the silicide layers 52 may function to reduce the gate resistance and thereby improve the switching performance.

Figure 10:
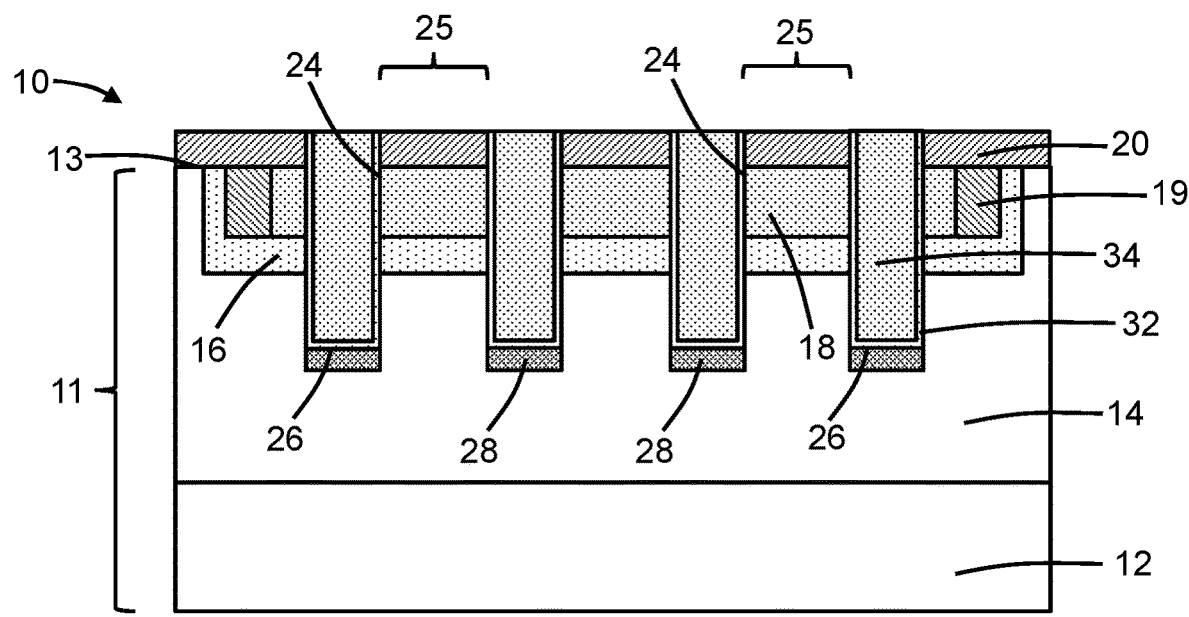
FIGS. 10, 10A, 10B are cross-sectional views of a structure in accordance with alternative embodiments of the invention.
Figure 10A:
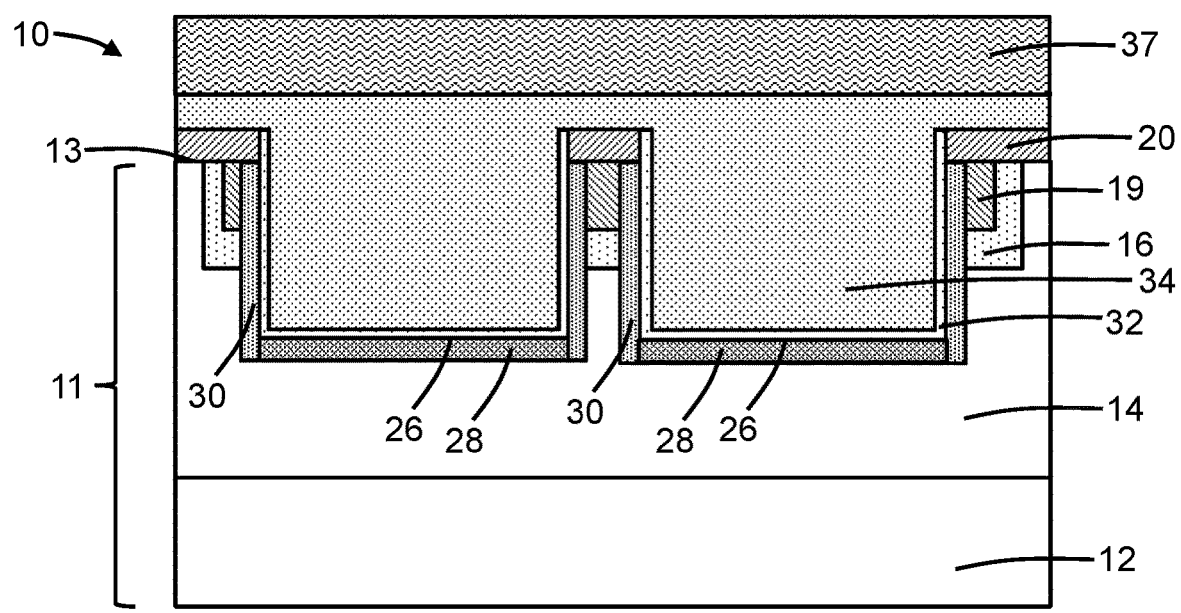
Figure 10B:
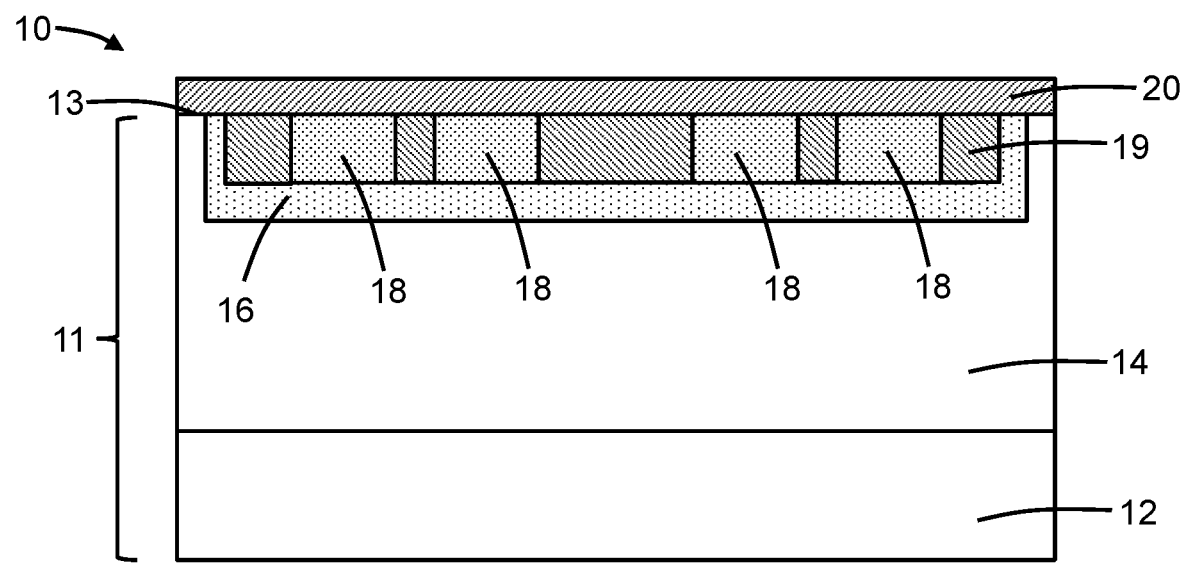

With reference to FIGS. 10, 10A, 10B and in accordance with alternative embodiments, the gate conductor layer 34 of the gate fingers may be formed without forming the recesses 36. In that regard, the etch mask 37 used to pattern the gate fingers may lack openings that are disposed over the portions of the gate conductor layer 34 between the portions in the adjacent trenches 22, 23. The process flow continues to form a structure 10 shown in FIGS. 9, 9A, 9B that lacks the recesses 36.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
    a semiconductor substrate including a top surface, a first doped region adjacent to the top surface, and a first trench that extends through the first doped region, the semiconductor substrate comprising a wide bandgap semiconductor material;
    a first gate structure comprising a gate conductor layer in the first trench; and
    a first dielectric layer on the top surface of the semiconductor substrate, the first dielectric layer including an opening that is aligned with the first trench in the semiconductor substrate, and the first dielectric layer comprising a material with a melting point that is greater than or equal to 2000° C.,
    wherein the first trench includes a trench bottom, a first sidewall, and a second sidewall that adjoins the first sidewall, the semiconductor substrate further includes a second doped region adjacent to the trench bottom of the first trench and a third doped region adjacent to the first sidewall of the first trench, and the third doped region extends from the second doped region to the top surface.

2. The structure of claim 1 wherein the first gate structure further includes a silicide layer on the gate conductor layer.

3. The structure of claim 2 wherein the silicide layer is disposed at least in part inside the opening in the first dielectric layer, the opening in the first dielectric layer has a first width dimension, and the silicide layer has a second width dimension that is substantially equal to the first width dimension.

4. The structure of claim 2 wherein the gate conductor layer includes a recess, and the silicide layer is disposed in the recess.

5. The structure of claim 4 further comprising:
a second dielectric layer disposed inside the opening on the silicide layer.

6. The structure of claim 1 wherein the semiconductor substrate further includes a second trench having sidewall adjacent to the second sidewall of the first trench and a channel region between the second sidewall of the first trench and the sidewall of the second trench.

7. The structure of claim 1 wherein the first doped region, the second doped region, and the third doped region have the same conductivity type.

8. The structure of claim 1 wherein the semiconductor substrate further includes a second trench, a third trench, a first channel region between the first trench and the second trench, and a second channel region between the first trench and the third trench, and further comprising:
a second gate structure including a gate conductor layer in the second trench; and
a third gate structure including a gate conductor layer in the third trench.

9. The structure of claim 1 wherein the material is an electrical insulator.

10. The structure of claim 1 wherein the material comprises aluminum nitride.

11. The structure of claim 1 wherein the material comprises polycrystalline silicon carbide.

12. The structure of claim 1 wherein the first dielectric layer includes a first sublayer and a second sublayer that is disposed on the first sublayer, the first sublayer comprises aluminum oxide, and the second sublayer comprises aluminum nitride or polycrystalline silicon carbide.

13. The structure of claim 1 wherein the first dielectric layer includes a first sublayer and a second sublayer that is disposed on the first sublayer, the first sublayer comprises aluminum nitride, and the second sublayer comprises polycrystalline silicon carbide.

14. The structure of claim 1 wherein the wide bandgap semiconductor material comprises silicon carbide.

15. A structure for a field-effect transistor, the structure comprising:
a semiconductor substrate including a top surface, a first doped region adjacent to the top surface, and a trench that extends through the first doped region, the semiconductor substrate comprising a wide bandgap semiconductor material;
a gate structure comprising a gate conductor layer in the trench;
a first dielectric layer on the top surface of the semiconductor substrate, the first dielectric layer including an opening that is aligned with the trench in the semiconductor substrate, and the first dielectric layer comprising a material with a melting point that is greater than or equal to 2000° C.; and
a second dielectric layer on the gate conductor layer, the second dielectric layer disposed at least in part inside the opening in the first dielectric layer.

16. The structure of claim 15 wherein the opening in the first dielectric layer has a first width dimension, and the second dielectric layer has a second width dimension that is substantially equal to the first width dimension.

17. The structure of claim 15 wherein the gate conductor layer includes a recess, and the second dielectric layer is disposed in the recess.

18. The structure of claim 15 wherein the second dielectric layer extends above the top surface of the semiconductor substrate.

19. The structure of claim 15 wherein the trench includes a trench bottom, a first sidewall, and a second sidewall that adjoins the first sidewall, the semiconductor substrate further includes a second doped region adjacent to the trench bottom of the trench and a third doped region adjacent to the first sidewall of the trench, and the third doped region extends from the second doped region to the top surface.

20. A method of forming a structure for a field-effect transistor, the method comprising:
forming a doped region adjacent to a top surface of a semiconductor substrate, wherein the semiconductor substrate comprises a wide bandgap semiconductor material;
forming a dielectric layer on the top surface of the semiconductor substrate, wherein the dielectric layer comprises a material with a melting point that is greater than or equal to 2000° C.;
forming an opening in the dielectric layer;
forming a trench in the semiconductor substrate that extends through the doped region, wherein the opening in the dielectric layer is aligned with the trench in the semiconductor substrate; and
forming a gate structure comprising a gate conductor layer in the trench, wherein the dielectric layer is present on the top surface of the semiconductor substrate during formation of the gate structure.

* * * * *